United States Patent
Tang et al.

(10) Patent No.: US 8,996,737 B1
(45) Date of Patent: Mar. 31, 2015

(54) METHOD FOR EMULATING COMMUNICATION STANDARDS OF TRANSCEIVER MODULES FOR NATIVE HOST DEVICES

(71) Applicant: Cisco Technology, Inc., San Jose, CA (US)

(72) Inventors: Norman Tang, Los Altos, CA (US); Jose Carlos Raygoza Echeagaray, Milpitas, CA (US); Liang Ping Peng, Santa Clara, CA (US); David Lai, Mountain View, CA (US); Anthony Nguyen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/056,089

(22) Filed: Oct. 17, 2013

(51) Int. Cl.
*G06F 3/00* (2006.01)
*G06F 9/455* (2006.01)

(52) U.S. Cl.
CPC ........................................ *G06F 9/455* (2013.01)
USPC ............................................................ 710/5

(58) Field of Classification Search
CPC .................. G06F 13/387; G06F 2213/3814
See application file for complete search history.

(56) References Cited

U.S. PATENT DOCUMENTS

| | | | |
|---|---|---|---|
| 2009/0257754 A1* | 10/2009 | Theodoras et al. | 398/135 |
| 2010/0274876 A1 | 10/2010 | Kagan et al. | |
| 2011/0255574 A1 | 10/2011 | Carter et al. | |
| 2011/0299858 A1 | 12/2011 | Mazzini et al. | |
| 2012/0003934 A1* | 1/2012 | Lydon et al. | 455/41.2 |
| 2012/0051735 A1 | 3/2012 | Achkir et al. | |
| 2012/0071011 A1 | 3/2012 | Kagan et al. | |

* cited by examiner

*Primary Examiner* — Idriss N Alrobaye
*Assistant Examiner* — Ronald Modo
(74) *Attorney, Agent, or Firm* — Edell, Shapiro & Finnan, LLC

(57) ABSTRACT

An adapter device is provided that is configured to interface with a host device according to a first communication standard via a first connector and with a transceiver module according to a second communication standard via a second connector. The adapter device detects that the transceiver module has connected to the adapter device. The adapter device retrieves transceiver module identifier information from the transceiver module and converts the transceiver module identifier information to the first communication standard. The converted transceiver module identifier information and adapter device identifier information are sent to the host device.

17 Claims, 8 Drawing Sheets

METHOD FOR EMULATING COMMUNICATION STANDARDS OF TRANSCEIVER MODULES FOR NATIVE HOST DEVICES

TECHNICAL FIELD

The present disclosure relates to enabling data transmissions between enhanced transceiver modules and legacy hosts.

BACKGROUND

In network environments, host devices, such as physical network nodes or network devices, are configured to communicate with each other in accordance with a communication standard. For example, a host device may be configured to send and receive data communications with other host devices in accordance with the Multiple Source Agreement (MSA) X2 standard. The host devices may communicate with one another via one or more optical transceiver devices or modules. The transceiver modules may be configured to send and receive communications in accordance with the X2 standard. Alternatively, the transceiver modules may be configured to deliver enhanced communications in accordance with other communication standards.

DESCRIPTION OF EXAMPLE EMBODIMENTS

Overview

An adapter device is provided that is configured to interface with a host device according to a first communication standard via a first connector and with a transceiver module according to a second communication standard via a second connector. The adapter device detects that the transceiver module has connected to the adapter device. The adapter device retrieves transceiver module identifier information from the transceiver module and converts the transceiver module identifier information to the first communication standard. The converted transceiver module identifier information and adapter device identifier information are sent to the host device.

Example Embodiments

Figure 1:
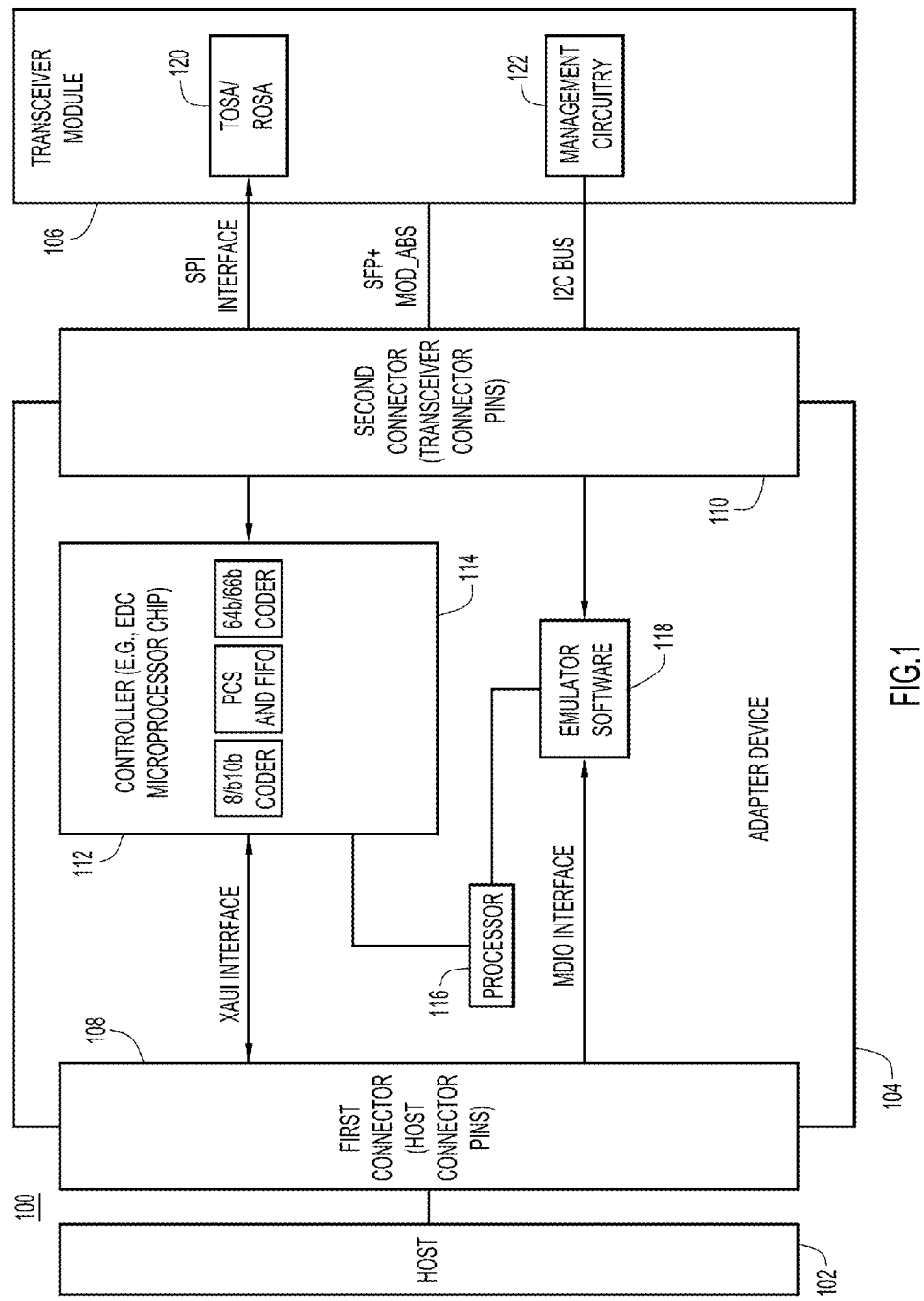
FIG. 1 shows a host device, a transceiver module and an adapter device configured to communicate with the host device and the transceiver module to emulate to the host device the communication standard of the transceiver module.

The techniques presented herein are directed to enabling data transmissions between enhanced transceiver modules and legacy host devices. An example topology or configuration is shown at reference numeral 100 in FIG. 1. FIG. 1 shows a host device 102, an adapter device 104 and a transceiver module 106. The adapter device 104 interfaces with the host device 102 via a first connector on the adapter device 104. The first connector is shown at reference numeral 108 in FIG. 1 and comprises, for example, a first set of connector pins. The adapter device 104 is also configured to interface with the transceiver module 106 via a second connector on the adapter device 104. The second connector is shown at reference numeral 110 in FIG. 1 and comprises, for example, a second set of connector pins. When the adapter device 104 interfaces with the host device 102, the adapter device 104 and the host device 102 can exchange communications according to a first communication standard. Similarly, when the adapter device 104 interfaces with the transceiver module 106, the adapter device 104 and the transceiver module 106 can exchange communications according to a second communication standard.

It should be appreciated that, according to one embodiment, the first communication standard may be a legacy communication standard according to which the host device 102 is configured to exchange communications, and the second communication standard may be an enhanced communication standard according to which the transceiver module 106 is configured to exchange communications. For example, the first communication standard may be a Multiple Source Agreement (MSA) X2 communication standard, and the second communication standard may be a MSA Small Form-Factor Pluggable Plus (SFP+) communication standard. It should be appreciated that in other embodiments, the first communication standard and the second communication standard may be the same communication standard, or the first communication standard may be an enhanced communication standard and the second communication standard may be a legacy communication standard. For simplicity, the techniques described herein refer to the first communication standard (i.e., the communication standard associated with the host device 102) as a legacy communication standard and the second communication standard (i.e., the communication standard associated with the transceiver module 106) as an enhanced communication standard. As such, the techniques described herein refer to the X2 communication standard as an example of the legacy communication standard and refer to the SFP+ communication standard as an example of the enhanced communication standard. Thus, the host device 102 may be referred to as an "X2 host device" or "X2 host" and the transceiver module 106 may be referred to as an "SFP+ transceiver module." It should be appreciated, though, that the techniques described herein are applicable to any communication standards now known or heretofore contemplated.

As stated above, the adapter device 104 is configured to interface with the host device 102 via the first connector 108 and with the transceiver module 106 via the second connector 110. The adapter device 104 also has a controller, shown at reference numeral 112. The controller 112 may be a network processor that is configured to execute high-speed logic or software, shown at reference numeral 114, for high-speed traffic between the host device 102 and the transceiver module 106. The adapter device 104 also has a processor 116. The processor 116 is configured to execute emulator software 118. The emulator software 118, for example is stored in memory (e.g., random access memory (RAM) or read-only memory (ROM)). The transceiver module has a transmit optical subassembly (TOSA)/receiver optical subassembly (ROSA) unit at 120 and management circuitry at 122.

In general, when the adapter device 104 interfaces with the host device 102 via the first connector 108 and interfaces with the transceiver module 106 via the second connector 108, the host device 102 and the transceiver module 106 are able to exchange communications with each other, even though the host device 102 may be of a different communication standard than the transceiver module 106. That is, when the adapter device 104 is connected to both the host device 102 and the transceiver module 106, the adapter device 104 provides a method for emulating the communication standard of the transceiver module 106 as the first communication standard of the host device 102, even though the transceiver module 106 is of the second communication standard. That is, for an X2 host and an SFP transceiver module, when the adapter device 104 is connected to the X2 host and the SFP transceiver module, the adapter device 104 emulates the communication standard of the SFP transceiver module as an X2 communication standard (i.e., the same as the X2 host), even though the transceiver module is of the SFP communication standard. As a result, from the perspective of the host device 102, the host device 102 detects that a transceiver module has been connected with the same communication standard, e.g., the X2 communication standard, thus enabling communications to be exchanged between the host device 102 and the transceiver module 106 (via the adapter device 104). These emulation techniques enable enhanced transceiver modules (such as the SFP transceiver module) to communicate with legacy host devices (such as the X2 host). The emulation techniques are described in detail herein. As stated above, the emulation techniques described herein are not limited to a specific form factor or communication standard, but rather, the techniques apply to any form factors or communication standards now known or foreseen.

It should be appreciated that the processor 116 is, for example, a microprocessor or microcontroller that is configured to execute program logic instructions (i.e., software) for carrying out the various emulation operations and tasks, as described herein. For example, the processor 116 is configured to execute the emulator software 118. The functions of the processor 116 may be implemented by logic encoded in one or more tangible computer readable storage media or devices (e.g., storage devices compact discs, digital video discs, flash memory drives, etc. and embedded logic such as an application specific integrated circuit, digital signal processor instructions, software that is executed by a processor, etc.).

The emulator software may take any of a variety of forms, so as to be encoded in one or more tangible computer readable memory media or storage device for execution, such as fixed logic or programmable logic (e.g., software/computer instructions executed by a processor), and the processor 116 may be an application specific integrated circuit (ASIC) that comprises fixed digital logic, or a combination thereof.

For example, the processor 116 may be embodied by digital logic gates in a fixed or programmable digital logic integrated circuit, which digital logic gates are configured to perform the operations of the emulator software 118. In general, the emulator software 118 may be embodied in one or more computer readable storage media encoded with software comprising computer executable instructions and when the software is executed operable to perform the operations described hereinafter. It should be appreciated that the operations performed by the emulator software 118 may also be performed by hardware components.

Figure 2:
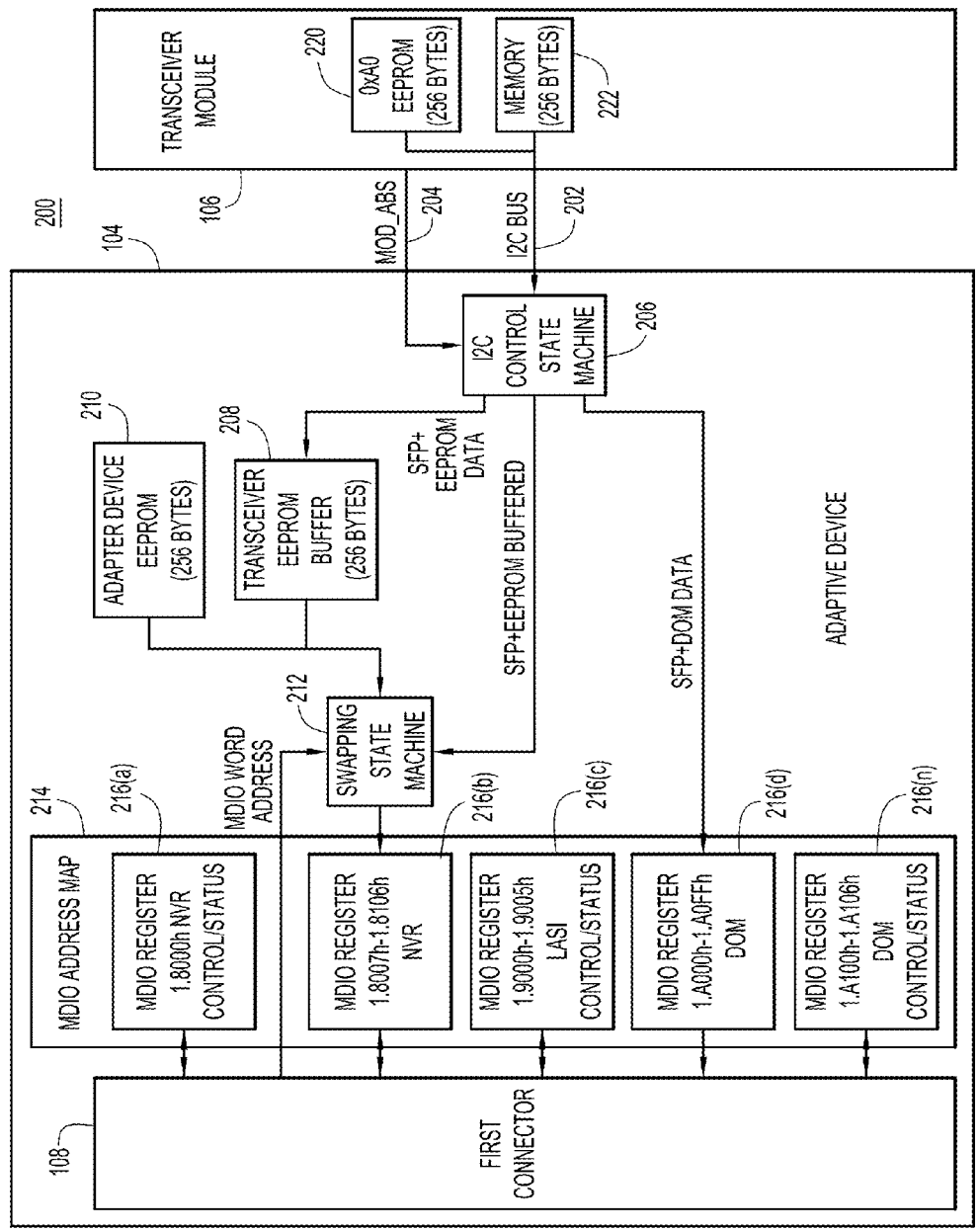
FIG. 2 shows functional block representations of the adapter device configured to perform management operations to emulate the communication standard to the host device.

Reference is now made to FIG. 2. FIG. 2 shows an example topology 200 of components of the adapter device 104 configured to perform the emulation techniques. In FIG. 2, the adapter device 104 is connected to the transceiver module 106 (e.g., via the second connector 110 shown in FIG. 1). When the adapter device 104 is connected to the transceiver module 106, the adapter device 104 and the transceiver module 106 can exchange communications with each other. For example, the adapter device 104 can exchange management communications with the transceiver module 106 via one or more links, shown at reference numerals 202 and 204. In FIG. 2, link 202 is an inter-integrated circuit ("I2C") bus link and link 204 is a link that detects the presence or absence of a transceiver module (shown as a "MOD_ABS" link). In FIG. 2, the adapter module 104 is shown as having several software management modules. These modules may be stored in memory components of the adapter module 104, and the operations of the modules described herein may be executed by the processor 116 in FIG. 1. Specifically, the adapter module 104 comprises an I2C control state machine module 206, a transceiver module Electrically Erasable Programmable Read-Only Memory (EEPROM) buffer 208, an adapter EEPROM buffer 210, a swapping state machine module 212 and an address table 214. In one example, the EEPROM buffer 208 is a Random Access Memory (RAM) unit. It should be appreciated that the term "buffer" as used herein describes duplicating content of a particular memory unit. The address table 214 stores, among other components, identifier information associated with the adapter device 104 and identifier information associated with the transceiver module 106 at particular address locations. In one example, the address table 214 may be a Management Data Input/Output (MDIO) address table that is configured to store identifier information of the adapter device 104 and the transceiver module 106 in particular address locations. FIG. 2 shows address locations at 216(a)-216(n). The transceiver module 106 has its own memory components. For example, the transceiver module 106 has an EEPROM 220 and memory 222.

As stated above, the adapter device 104 is also configured to connect to the host device 102 (via the first connector 108). When the adapter device 104 is connected to the host device 102 and with the transceiver module 106, the adapter device 104 receives request commands originating from the host device 102 for identifier information stored in the address location 216(b) in its address table 214. For example, the host device 102 may send a software command (e.g., automatically or at the initiation of a user of the host device 102) to the adapter device 104 to retrieve identifier information associated with the adapter device 104. These commands are received by the adapter device 104 (e.g., via the first connector 108) and are processed by processor 116 at the instruction of the swapping state machine module 212 and the I2C control state machine module 206.

In addition to sending software commands to the adapter device 104 for retrieving identifier information, the host device 102 may send other software commands to the adapter device 104. For example, the host device 102 may send software commands to the adapter device 104 to read inventory information. This inventory information may comprise, among other things, identifier information of the adapter device 104. In other words, the host device 102 may send commands to the adapter device 104 to instruct the adapter device 104 to retrieve information (e.g., identifier information) of the adapter device 104 and to send the information to the host device 102.

Typically, the host device 102 is configured to send commands to a device connected to it to obtain identifier information of only that device. However, in the techniques described herein, the adapter device 104 is connected to the transceiver module 106, and thus, when the adapter device 104 connects to the host device 102, the host device 102 needs to obtain identifier information of both the adapter device 104 and the transceiver module 106. That is, when the adapter device 104 is connected to the host device 102, the host device 102 believes that the adapter device 104 itself is a transceiver module, regardless of whether or not the transceiver module 106 is connected to the adapter module 104. Accordingly, when the software commands are sent from the host device 102 to the adapter device 104, in traditional or typical operations, only the identifier information of the adapter device 104 (and not the identifier information of the transceiver module 106) is provided to the host device 102. This is problematic, since without the identifier information of the transceiver module 106, the host device 102 is unable to exchange communications with the transceiver module 106. For example, an end user may need to collect all of the inventory information from an entire system to know what is in the system. There may be potential issues on a specific transceiver, and the user may need to schedule a replacement for the transceiver during maintenance of the transceiver. The techniques described herein alleviate these shortcomings by enabling the adapter device 104 to leverage the software commands typically received from the host device 102 to send the identifier information of both the adapter device 104 and the transceiver module 106 to the host device 102. Additionally, the adapter device 104 converts the identifier information of the transceiver module 106 to indicate a first communication standard of the host device 102. Thus, upon the host device 102 receiving the identifier information of the transceiver module 106, the communication standard of the transceiver module 106 is effectively emulated from the perspective of the host device 102 to appear as that of the same communication standard as the host device 102. The communication standard of the transceiver module 106 is emulated without having to update the software of the host device 102.

Figure 3:
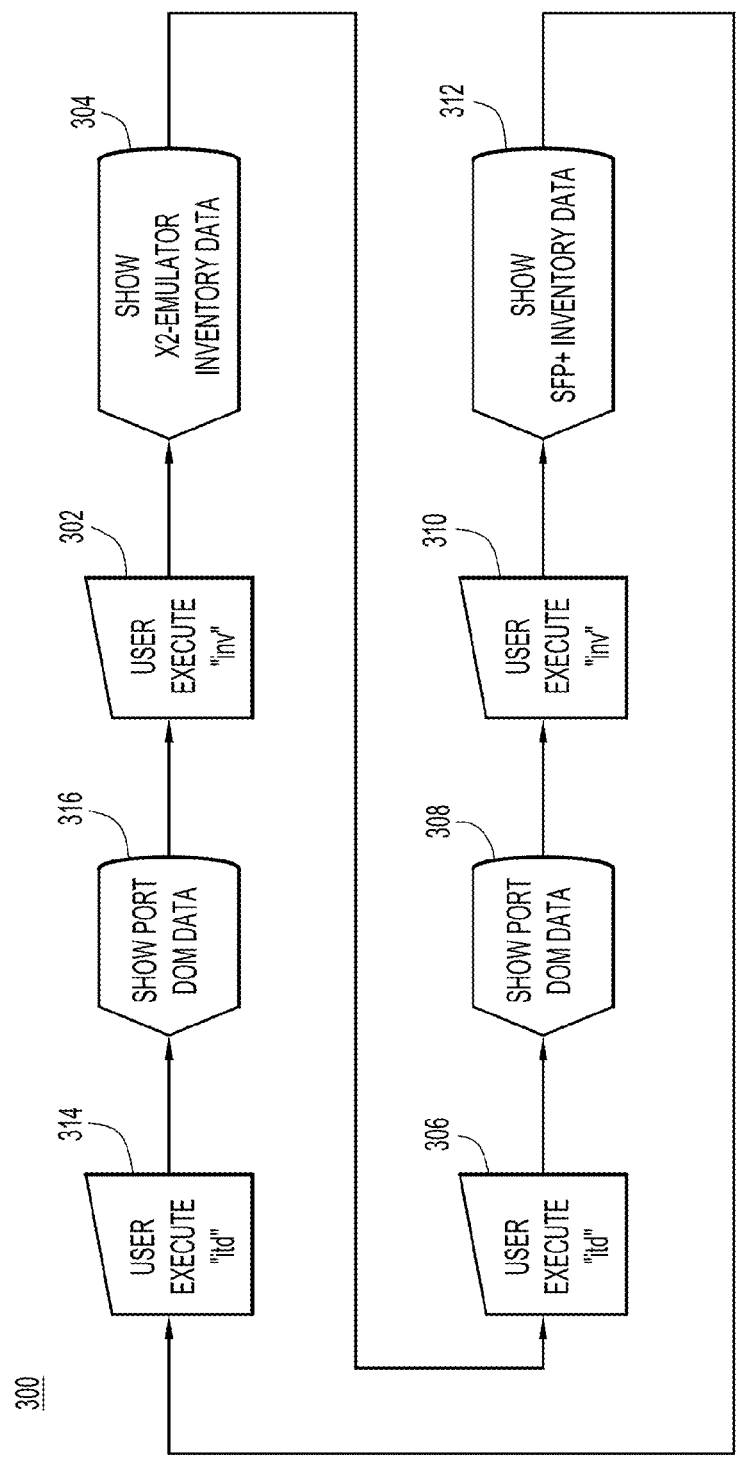
FIG. 3 shows an example flow diagram depicting operations of the adapter device providing to the host device identifier information for the adapter device and identifier information for the transceiver module.

Reference is now made to FIG. 3. FIG. 3 shows an example flow diagram 300 depicting operations of the adapter device 104 providing to the host device identifier information for both the adapter device 104 and the transceiver module 106. As stated above, by providing the identifier information of both the adapter device 104 and the transceiver module 106 to the host device 102, the adapter device 104 is able to emulate the communication standard of the transceiver module 106 to appear, from the perspective of the host device 102, as that of the same communication standard as the host device 102. At reference numeral 302, the host device 102 sends a first software command ("first command") to the adapter device 104. The first command is, for example, a command configured to instruct the adapter device to provide inventory information of the adapter device 104. The first command may be sent by a user of the host device 102. The first command is shown as an "inv" command in FIG. 3, which, in one example, is a standard inventory command that the host device 102 is configured to send. Upon receiving the first command, the adapter device 104, at operation 304, provides the identifier information of the adapter device 104 to the host device 102. That is, the first command retrieves at a particular address in memory (e.g., the address table 214) of the adapter device 104 the identifier information that is stored at the particular address. In this example, the identifier information that is stored at the particular address is the identifier information of the adapter device 104, though it should be appreciated, and will become apparent, that the identifier information of the transceiver module 106 may also be stored at the particular address.

At reference 306, the host device 102 sends a second software command ("second command") to the adapter device 104. The second command may be sent by a user of the host device 102 and is, for example, a command configured to instruct the adapter device 104 to provide interface transceiver DOM (Digital Optical Monitor) information of the adapter device 104. That is, when the adapter device 104 connects to the host device 102, the host device 102 perceives the adapter device 104 to be a transceiver module. Thus, the host device 102 may send a command requesting the transceiver DOM (Digital Optical Monitor) information of the device (adapter device 104) which it perceives to be a transceiver module. The second command is shown as an "itd" command in FIG. 3, which, in one example, is a standard command that the host device 102 is configured to send. Upon receiving the second command, the adapter device 104, at operation 308, swaps the identifier information of the adapter device 104 stored at the particular address in the memory 216(b) (and retrieved by the prior first command) with the identifier information of the transceiver module 106. That is, in response to receiving the second command, the adapter device 104 is provisioned to obtain the identifier information of the transceiver module 106 from the transceiver module 106 and is configured to insert the identifier information of the transceiver module 106 into the particular address 216(b) in the memory that previously stored the identifier information of the adapter device 104. It should be appreciated that the adapter device 104 may convert the identifier information of the transceiver module 106 from the second communication standard (of which the transceiver module 106 belongs) to the first communication standard (of which the host device 102 belongs). Thus, the converted identifier information of the transceiver module 106 may emulate the communication standard of the host device 102.

At operation 310, the host device 102 sends the first command (the "inv" command") again to the adapter device 104. At this point, however, the identifier information that is stored at the particular address 216(b) is the identifier information of the transceiver module 106 (as a result of the swapping operations performed by the adapter device 104 in response to receiving the second command). Thus, upon receiving the first command again from the host device 102, the adapter device 104, at operation 312, provides to the host device 102 the identifier information stored at the particular address 216(b), which is now the identifier information of the transceiver module 106 (e.g., the converted identifier information). Thus, the host device 102 is able to obtain the identifier information of both the transceiver module 106 and the adapter device 104. At 314, the host device 102 sends the second command again to the adapter device 104, and in response to receiving the second command, at 316, the adapter device 104 swaps the transceiver module identifier information with the adapter device identifier information at the particular address 216(b). The process then reverts to operation 302, where the host device 102 sends another first command to the adapter device 104 to retrieve the adapter device identifier information stored at the particular address 216(b).

Figure 4:
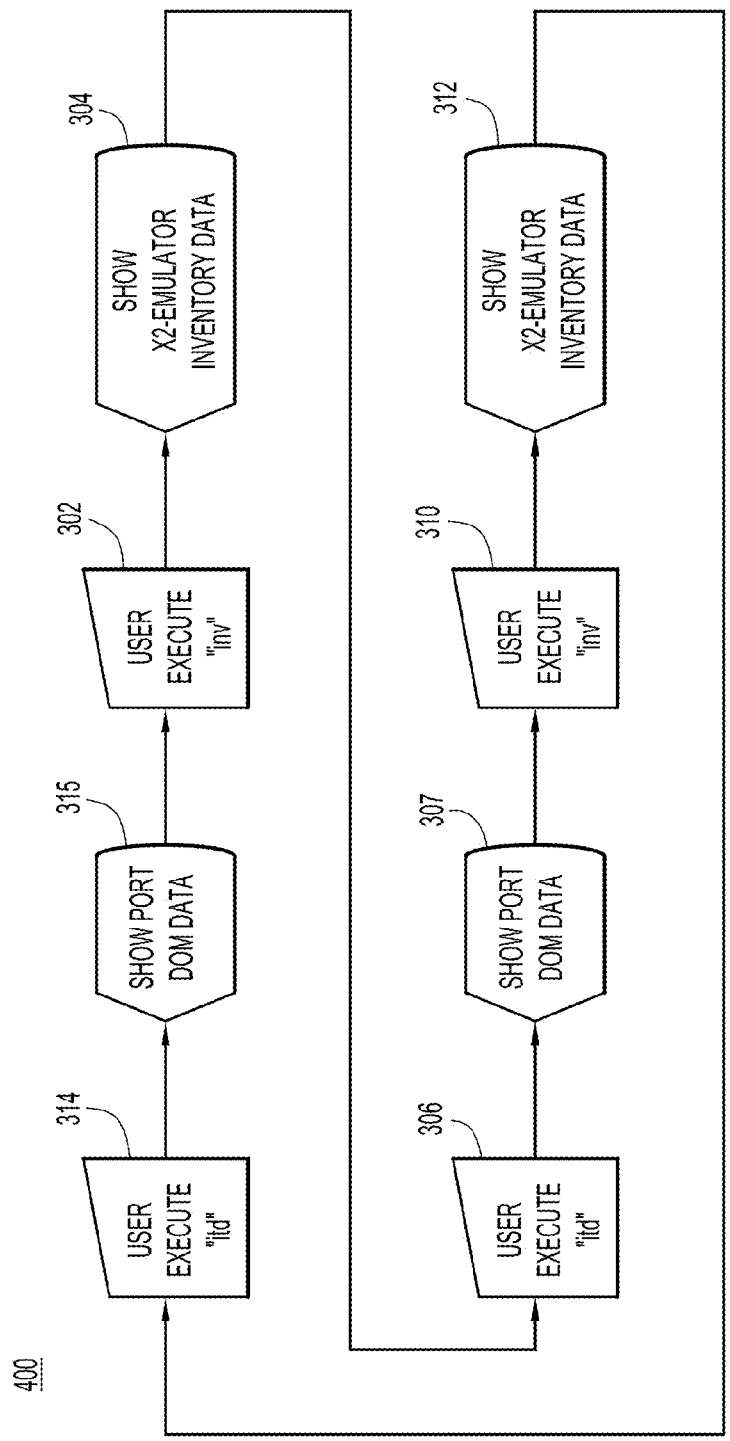
FIG. 4 shows an example flow diagram depicting operations of the adapter device providing to the host device identifier information of only the adapter device.

Reference is now made to FIG. 4, which shows an example flow diagram 400 depicting operations for the adapter device 104 providing to the host device 102 identifier information for only the adapter device since the transceiver module 106 is not presented in the adapter device 104. The operations in FIG. 4 are similar to those described in connection with FIG. 3, with the exception of operations 307 and 315 described below. For example, at reference numeral 302, the host device 102 sends the first command to the adapter device 104, and at reference numeral 304, the adapter device 104 provides the adapter device identifier information stored in the particular address 216(*b*). At operation 306, the host device 306 sends the second command to the adapter device 104. However, at 307 in FIG. 4, the adapter device 104 does not swap the adapter device identifier information with the transceiver module identifier information due to the transceiver module 106 is not presented. In one example, the adapter device 104 may be provisioned not to swap the identifier information or the transceiver module 106 may not be connected to the adapter device. At operation 310, the host device 102 sends the first command again to the adapter device 104, and at operation 312, the adapter device 104 provides the adapter device identifier information again to the host device 102. At operation 314, the host device 102 sends the second command again to the adapter device 104, and again, at operation 315, the adapter device 104 does not swap the adapter device identifier information with the transceiver module identifier information. Thus, in FIG. 4, only the adapter device identifier information is provided to the host device 102 by the adapter device 104.

Figure 5A:
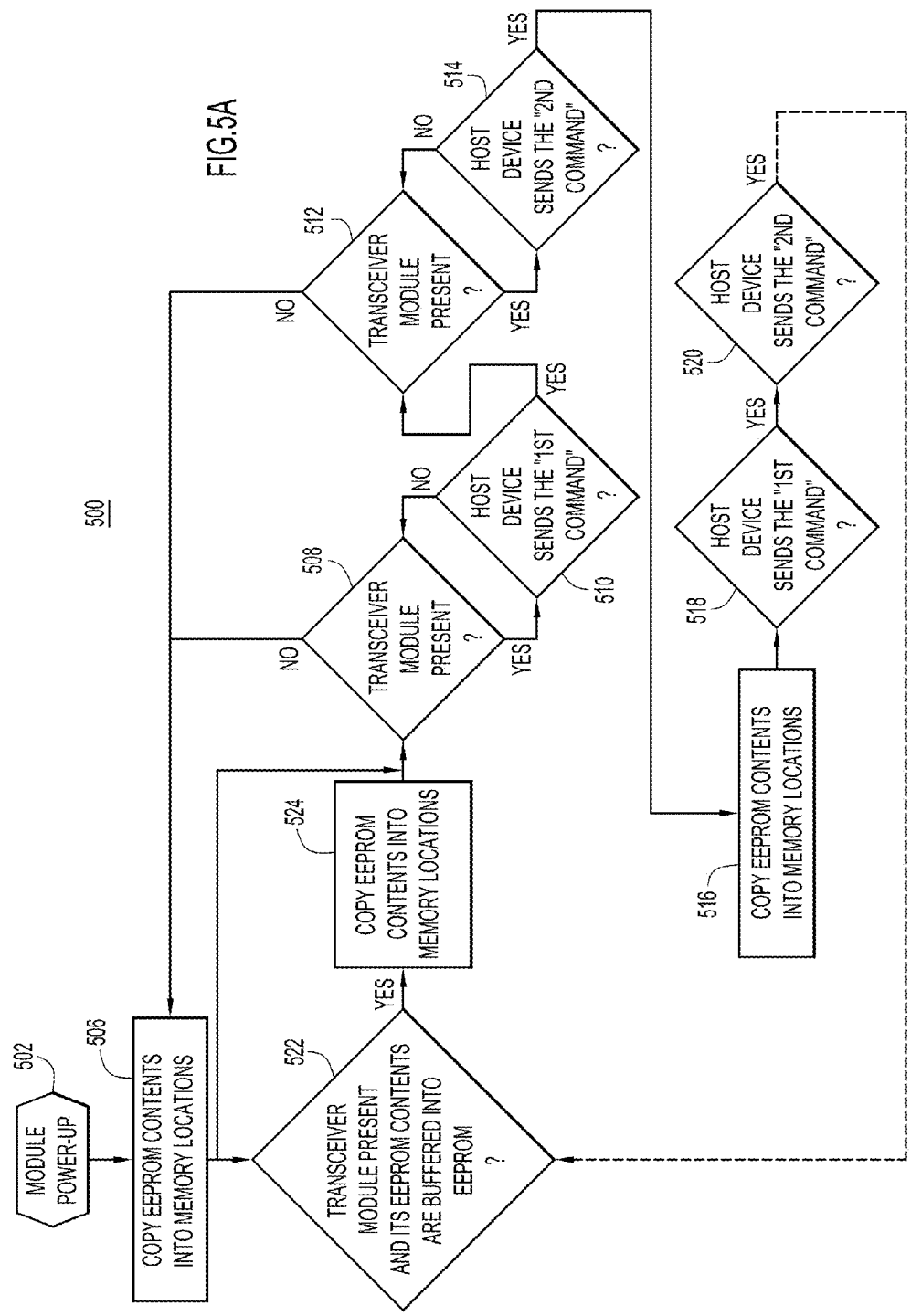
FIGS. 5A and 5B show example flow diagrams depicting operations of the adapter device emulating to the host device a communication standard of the transceiver module.
Figure 5B:
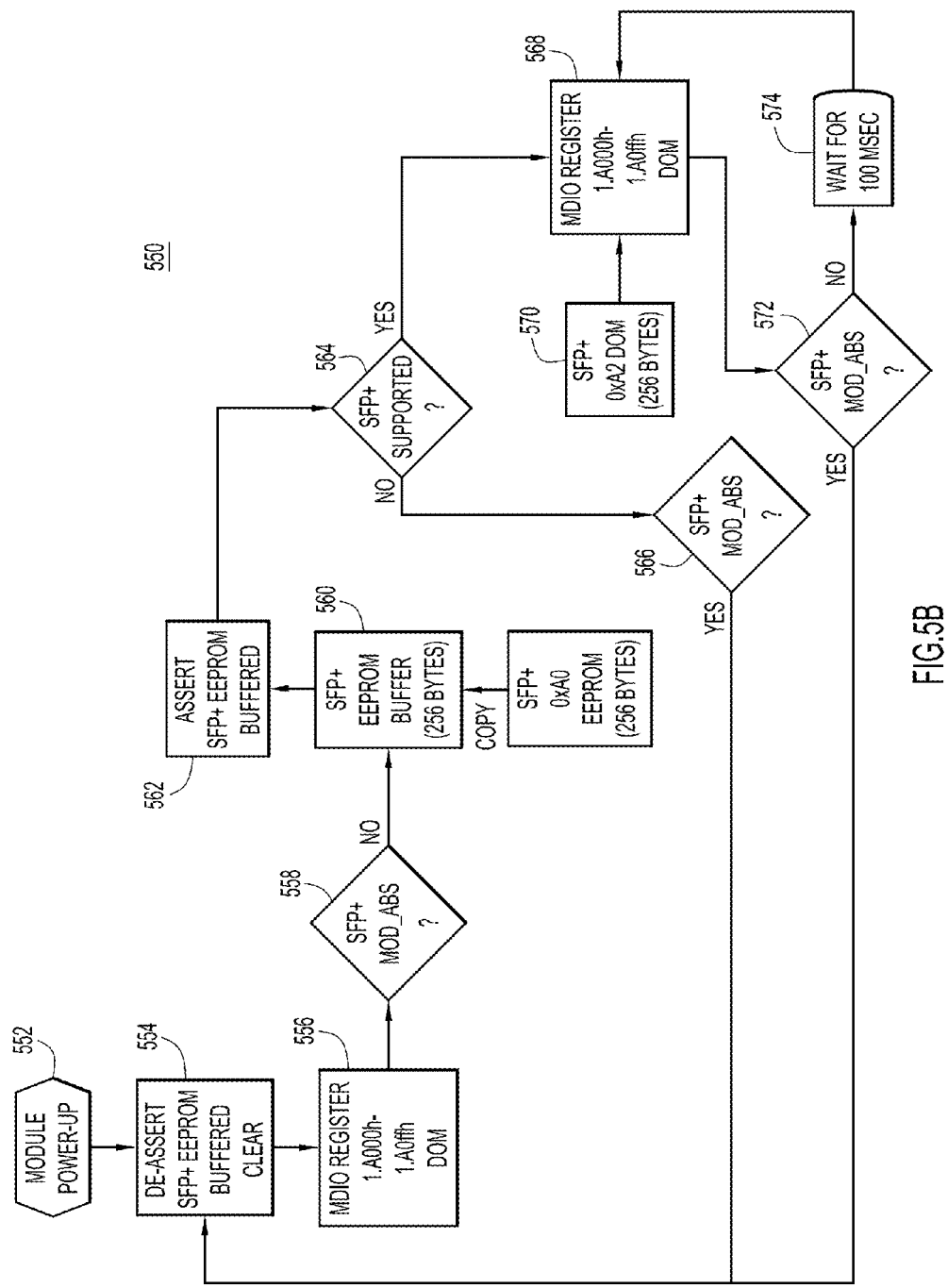

Reference is now made to FIGS. 5A and 5B which show example flow diagrams depicting operations for the adapter device 104 to perform the emulation techniques to enable the transceiver module 106 to exchange communications with the host device 102. Specifically, FIG. 5A shows operations that are performed by the processor 116 in response to executing logic of the swapping state machine module 212, and FIG. 5B shows operations that are preformed by the processor 116 in response to executing logic of the I2C control state machine module 206.

Referring first to the flow chart 500 in FIG. 5A, at reference numeral 502, the transceiver module powers up, and at reference numeral 506, contents of the adapter device EEPROM 210 are copied into memory location 216(*b*). Flow then proceeds to operations 508 and 522. At operation 508, a determination is made as to whether or not the transceiver module 106 is present. If so at operation 510, a determination is made as to whether the host device 102 sends the first command. If the host device 102 sends the first command, a determination is made at operation 512 as to whether the transceiver module 106 is present. If the transceiver module 106 is present, at operation 514, a determination is made as to whether the host device 102 sends the second command. If so, at 516, contents of the EEPROM 210 are copied into the memory location 216(*b*), and at 518, a determination is made again as to whether the host device 102 sends the first command. If so, another determination is made, at 520, as to whether the host device 102 sends the second command. If the host device 102 sends the second command again, a determination is made, at 522, as to whether the transceiver module 106 is present and whether its EEPROM 222 contents are buffered into the EEPROM 208. If so, flow proceeds to operation 524 where the EEPROM contents are copied into memory locations, and then flow proceeds to operation 508. It should be appreciated that in FIG. 5A, operations that do not depict a "no" path repeat until a "yes" event occurs.

Reference is now made to FIG. 5B. FIG. 5B shows a flow chart 550 depicting operations performed by the I2C control state machine ("state machine") 206. At reference numeral 552, transceiver module 106 powers up, and at 554, the state machine 206 de-asserts the transceiver module EEPROM buffered status. At 556, the state machine 206 clears the address location 216(*d*) in address map 214 of DOM. A determination is made, at 558, as to whether the transceiver module is present (e.g., if the transceiver "MOD_ABS" indication is "no"). If the transceiver module is present, at operation 560, the state machine 206 buffers the identifier information of the transceiver module EEPROM 222 into the transceiver module EEPROM buffer 208 stored at the adapter device 104. If the answer to the operation 558 is "yes," the operation remains at 558. At operation 562, when the buffering is complete, the buffer status is asserted. At operation 564, a determination is made as to whether the transceiver module 106 is DOM supported. If not, at operation 566, the state machine 206 continuously monitors to determine if the transceiver module 106 is present (connected) or absent (not connected). If the answer to the operation 566 is "no," the operation remains at 566. When the transceiver module 106 is absent, the state machine 206 reverts to operation 554 and de-asserts the transceiver module EEPROM buffered status and clears the address 216(*d*) in address map 214 of DOM information.

If the transceiver module 106 is DOM supported (i.e., if the answer to operation 564 is "yes"), at operation 568, the transceiver module 106 registers the DOM information from 220 into an address register 216(*d*) of the address map 214. In other words, at operation 568, the DOM information of the transceiver module 106 is buffered to the adapter device 104. Since the DOM information in the transceiver module 106 is real-time information that may be updated in the transceiver module 106 periodically (e.g., every 100 milliseconds), if the transceiver module 106 is continuously present, the process 550 waits until the real-time information is updated. For example, as shown at operation 570, the transceiver module DOM information is registered into the address locations 216(*d*) of the address map 214. It should be appreciated that the operation 570 relates to the EEPROM of the transceiver module 106.

At operation 572, the state machine 206 continuously monitors to determine if the transceiver module 106 is present (connected) or absent (not connected). If the transceiver module 106 is present, the process continues to operation 574, waits a predetermined period of time (e.g., 100 milliseconds, as described above) and then updates the DOM information in operation 568. After doing so, the process reverts to operation 572 to determine if the transceiver module 106 is present (connected) or absent (not connected). When the transceiver module 106 is absent, the state machine 206 reverts to operation 554 and de-asserts the transceiver module EEPROM buffered status and clears the address locations 216(*d*) in the address map 214 of DOM information.

Figure 6:
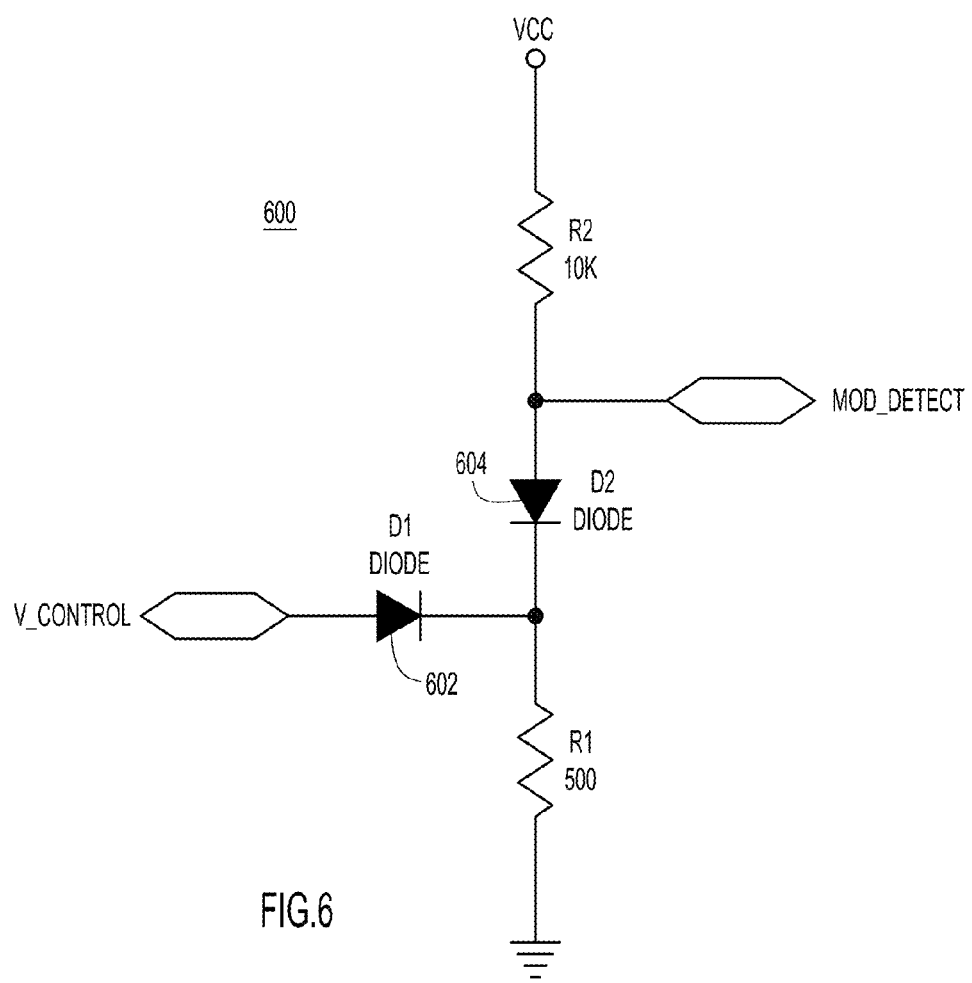
FIG. 6 shows an example diagram depicting circuitry of the adapter device configured to send a ready signal of identifier information of the adapter device and the transceiver module to the host device.

Reference is now made to FIG. 6, which shows an example schematic diagram depicting circuitry 600 of the adapter device 104 configured to send identifier information of the adapter device 104 and the transceiver module 106 to the host device 102. The circuitry 600 in FIG. 6 includes a plurality of diodes at reference numerals 602 and 604. The V_Control is driven by the processor 116 in the adapter module 104. When the transceiver module 106 is connected to the adapter device 104, the diode 604 turns on and the R1 resistor pulls down the Mod_Detect (module detect) signal. In one example, the Mod_Detect signal is a "module detect" signal to inform the host device 102 that a device/module 106 is inserted. The host device 102 can determine that the new device/module 106 is inserted based on the rising edge of the Mod_Detect signal. The host device 102 can then read the identification information from the new device/module 106. When the transceiver module 106 is not connected to the adapter device 104, the R1 resistor pulls down the Mod_Detect signal until a transceiver module 106 is connected to the adapter device 104. After this, the Mod_Detect is set at a high voltage for one second (or other appropriate interval) by the processor 116 which drives the V_Control to high voltage, after which the processor 116 drives the V_Control to low voltage or open-circuit that the diode 604 turns on, the R1 resistor pulls down the Mod_Detect signal again.

Figure 7:
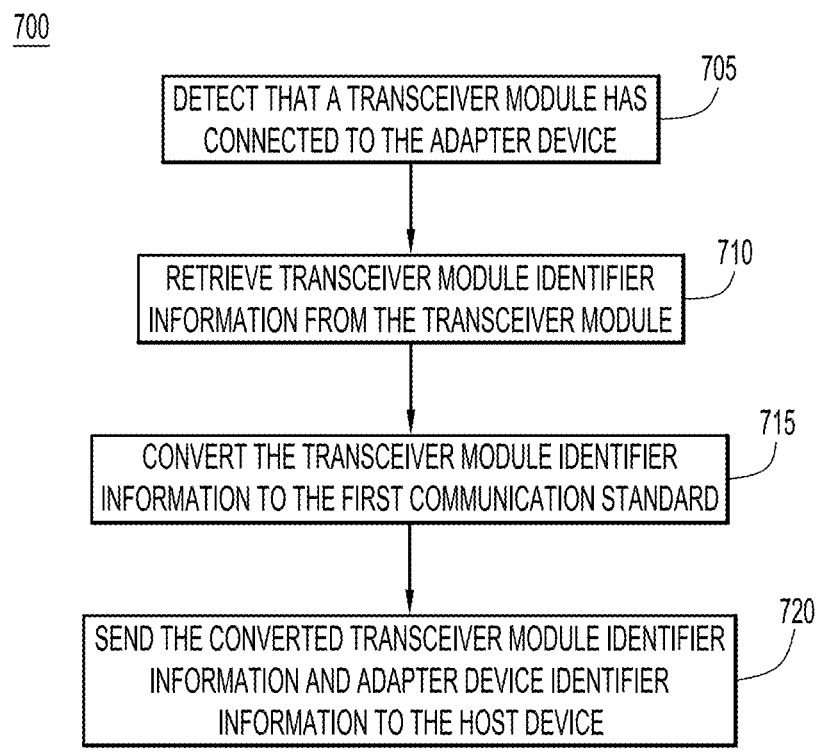
FIG. 7 shows an example flow chart depicting operations for performing the emulation operations at the adapter device.

Reference is now made to FIG. 7, which shows an example flow chart depicting a method 700 for performing the emulation at the adapter device. It should be appreciated that the operations in FIG. 7 may be performed by the processor 116 of the adapter device 104. At 705, the adapter device 104 detects that the transceiver module 106 is connected to the adapter device. At operation 710, transceiver module identifier information is retrieved from the transceiver module. The transceiver module identifier information is converted, at operation 715, to the first communication standard, and at operation 720, the converted transceiver module identifier information and adapter device identifier information are sent to the host device 102.

The adapter device 104 may also store, at the particular address in memory of the adapter device identifier information that is either adapter device identifier information or the converted transceiver module identifier information. The adapter device 104 may receive from the host device 102 the first command requesting the identifier information stored at the particular address. In response to receiving the first command, the adapter device 104 may provide to the host device 102 the identifier information stored at the particular address in the memory of the adapter device. A second command is received from the host device requesting access to information about processing resources of the adapter device. In response to receiving the second command and (1) if upon receiving the second command, the adapter device identifier information is stored at the particular address in the memory, the adapter device identifier information is swapped with the converted transceiver module identifier information, and (2) if upon receiving the second command, the converted transceiver module identifier information is stored at the particular address in the memory, the converted transceiver module identifier information is swapped with the adapter device identifier information.

It should be appreciated that the techniques described above in connection with all embodiments may be performed by one or more computer readable storage media that is encoded with software comprising computer executable instructions to perform the methods and steps described herein. For example, the operations performed by the adapter device 104 may be performed by one or more computer or machine readable storage media or device executed by a processor and comprising software, hardware or a combination of software and hardware to perform the techniques described herein.

In summary, a method is provided comprising: at an adapter device that is configured to interface with a host device according to a first communication standard via a first connector and with a transceiver module according to a second communication standard via a second connector, detecting that the transceiver module has connected to the adapter device; retrieving transceiver module identifier information from the transceiver module; converting the transceiver module identifier information to the first communication standard; and sending the converted transceiver module identifier information and adapter device identifier information to the host device.

In addition, an apparatus is provided comprising: a first connector configured to electrically connect with a host device according to a first form factor; a second connector configured to electrically connect with a transceiver module according to a second form factor; a controller configured to exchange control signals with the transceiver module via the first connector and to exchange control signals with the host device via the second connector; a memory configured to store identifier information at a particular address; and a processor coupled to the memory and the controller, and further configured to: detect that the transceiver module has connected to the second connector; retrieve transceiver module identifier information from the transceiver module; convert the transceiver module identifier information to the first communication standard; and send the converted transceiver module identifier information and identifier information of the apparatus to the host device.

Furthermore, one or more computer readable storage media is provided that is encoded with software comprising computer executable instructions and when the software is executed operable to: detect, at an adapter device that is configured to interface with a host device according to a first communication standard via a first connector and with a transceiver module according to a second communication standard via a second connector, that the transceiver module has connected to the adapter device; retrieve transceiver module identifier information from the transceiver module; convert the transceiver module identifier information to the first communication standard; and send the converted transceiver module identifier information and adapter device identifier information to the host device.

The above description is intended by way of example only. Various modifications and structural changes may be made therein without departing from the scope of the concepts described herein and within the scope and range of equivalents of the claims.

What is claimed is:

1. A method comprising:
at an adapter device that is configured to interface with a host device according to a first communication standard via a first connector and with a transceiver module according to a second communication standard via a second connector, detecting that the transceiver module has connected to the adapter device;
retrieving transceiver module identifier information from the transceiver module;
converting the transceiver module identifier information to the first communication standard;
sending the converted transceiver module identifier information and adapter device identifier information to the host device;
storing at a particular address in memory of the adapter device identifier information that is either adapter device identifier information or the converted transceiver module identifier information;
responsive to receiving a first command from the host device requesting the identifier information, providing the identifier information stored at the particular address in the memory to the host device; and
responsive to receiving a second command from the host device requesting access to information about processing resources of the adapter device, (1) when the adapter device identifier information is stored at the particular address in the memory, swapping the adapter device identifier information with the converted transceiver module identifier information, and (2) when the converted transceiver module identifier information is stored at the particular address in the memory, swapping the converted transceiver module identifier information with the adapter device identifier information.

2. The method of claim 1, further comprising:
receiving another instance of the first command from the host device; and
in response to receiving another instance of the first command, sending to the host device the identifier information that is stored at the particular address in the memory such that as a result of the sending the host device has both the adapter device identifier information and the converted transceiver module identifier information.

3. The method of claim 2, further comprising emulating the first communication standard for communicating with the host device by sending to the host device the identifier information that is stored at the particular address in the memory.

4. The method of claim 2, further comprising emulating the first communication standard so as to enable the transceiver module to exchange communications with the host device according to the second communication standard that is different from the first communication standard.

5. The method of claim 1, wherein:
receiving the first command comprises receiving the first command comprising information configured to instruct the adapter device to provide inventory information of the adapter device; and
receiving the second command comprises receiving the second command comprising information configured to instruct the adapter device to provide interface transceiver capabilities of the adapter device.

6. The method of claim 1, wherein the first communication standard is a Multiple Source Agreement (MSA) X2 communication standard, and the second communication standard is a MSA Small Form-Factor Pluggable Plus (SFP+) communication standard.

7. The method of claim 1, further comprising: detecting that the transceiver module has not connected to the adapter device; and, in response thereto, providing to the host device only the adapter device identifier information.

8. The method of claim 1, wherein the adapter device identifier information comprises field replaceable unit identifier information of the adapter device and wherein the transceiver module identifier information comprises field replaceable unit identifier information of the transceiver module.

9. An apparatus comprising:
a first connector configured to electrically connect with a host device according to a first form factor;
a second connector configured to electrically connect with a transceiver module according to a second form factor;
a controller configured to exchange control signals with the transceiver module via the second connector and to exchange control signals with the host device via the first connector;
a memory configured to store identifier information at a particular address; and
a processor coupled to the memory and the controller, and further configured to:
detect that the transceiver module has connected to the second connector;
retrieve transceiver module identifier information from the transceiver module;
convert the transceiver module identifier information to the first communication standard; and
send the converted transceiver module identifier information and identifier information of the apparatus to the host device;
store at the particular address in the memory identifier information that is either identifier information of the apparatus or the converted transceiver module identifier information;
responsive to receiving from the host device via the first connector and the controller a first command requesting the identifier information stored at the particular address, provide to the host device via the controller and the first connector the identifier information stored at the particular address in the memory;
responsive to receiving from the host device via the second connector and the controller a second command requesting access to information about processing resources of the apparatus:
swap the identifier information of the apparatus with the converted transceiver module identifier information when upon receiving the second command, the identifier information of the apparatus is stored at the particular address in the memory; and
swap the converted transceiver module identifier information with the identifier information of the apparatus when upon receiving the second command, the converted transceiver module identifier information is stored at the particular address in the memory.

10. The apparatus of claim 9, wherein the processor is further configured to:
receive from the host device via the first connector and the controller another instance of the first command; and
in response to receiving another instance of the first command, send to the host device via the controller and the first connector the identifier information that is stored at the particular address in the memory such that as a result of sending the identifier information the host device has both the identifier information of the apparatus and the converted transceiver module identifier information.

11. The apparatus of claim 10, wherein the processor is further configured to emulate a first communication standard associated with the host device for communicating with the host device by sending to the host device via the controller and the first connector the identifier information that is stored at the particular address in the memory.

12. The apparatus of claim 10, wherein the processor is further configured to emulate the first communication standard so as to enable the transceiver module to exchange communications with the host device according to a second communication standard that is associated with the transceiver module and that is different from the first communication standard.

13. The apparatus of claim 9, wherein the processor is further configured to:
receive from the host device via the first connector and the controller the first command that comprises information configured to instruct the apparatus to provide inventory information of the apparatus; and
receive from the host device via the first connector and the controller the second command that comprises information configured to instruct the apparatus to provide interface transceiver capabilities of the apparatus.

14. One or more non-transitory computer readable storage media encoded with software comprising computer executable instructions and when the software is executed operable to:
detect, at an adapter device that is configured to interface with a host device according to a first communication standard via a first connector and with a transceiver module according to a second communication standard via a second connector, that the transceiver module has connected to the adapter device;

retrieve transceiver module identifier information from the transceiver module;

convert the transceiver module identifier information to the first communication standard;

send the converted transceiver module identifier information and adapter device identifier information to the host device;

store at a particular address in memory of the adapter device identifier information that is either adapter device identifier information or the converted transceiver module identifier information;

responsive to receiving a first command from the host device requesting the identifier information, provide the identifier information stored at the particular address in the memory to the host device; and responsive to receiving a second command from the host device requesting access to information about processing resources of the adapter device, (1) when the adapter device identifier information is stored at the particular address in the memory, swap the adapter device identifier information with the converted transceiver module identifier information, and (2) when the converted transceiver module identifier information is stored at the particular address in the memory, swap the converted transceiver module identifier information with the adapter device identifier information.

15. The computer readable storage media of claim 14, further comprising instructions operable to:

receive another instance of the first command from the host device; and in response to receiving another instance of the first command, send to the host device the identifier information that is stored at the particular address in the memory such that as a result of the sending the host device has both the adapter device identifier information and the converted transceiver module identifier information.

16. The computer readable storage media of claim 15, further comprising instructions operable to emulate the first communication standard for communicating with the host device by sending to the host device the identifier information that is stored at the particular address in the memory.

17. The computer readable storage media of claim 15, further comprising instructions operable to emulate the first communication standard so as to enable the transceiver module to exchange communications with the host device according to the second communication standard that is different from the first communication standard.

* * * * *